United States Patent
Flowers (12)

(10) Patent No.: US 11,054,193 B2
(45) Date of Patent: Jul. 6, 2021

(54) VEHICLE WITH VIBRATION ISOLATED ELECTRONICS

(71) Applicant: Amazon Technologies, Inc., Seattle, WA (US)

(72) Inventor: Jonathan Barak Flowers, Middlesex (GB)

(73) Assignee: Amazon Technologies, Inc., Seattle, WA (US)

( * ) Notice: Subject to any disclaimer, the term of this patent is extended or adjusted under 35 U.S.C. 154(b) by 293 days.

(21) Appl. No.: 15/993,048

(22) Filed: May 30, 2018

(65) Prior Publication Data

US 2019/0368826 A1    Dec. 5, 2019

(51) Int. Cl.
| | |
|---|---|
| *F28F 3/02* | (2006.01) |
| *B64C 39/02* | (2006.01) |
| *H05K 7/20* | (2006.01) |
| *F16F 9/42* | (2006.01) |
| *F16F 9/10* | (2006.01) |

(52) U.S. Cl.
CPC .............. *F28F 3/02* (2013.01); *B64C 39/024* (2013.01); *F16F 9/10* (2013.01); *F16F 9/42* (2013.01); *H05K 7/20854* (2013.01); *H05K 7/20872* (2013.01); *B64C 2201/024* (2013.01); *B64C 2201/108* (2013.01); *B64C 2201/165* (2013.01)

(58) Field of Classification Search
CPC ......... B64C 2201/024; B64C 2201/165; F16F 13/10; F16F 9/10; F16F 9/42; F28F 3/02; H05K 7/20454; H05K 7/20854; H05K 7/20872
USPC ....................................................... 244/175
See application file for complete search history.

(56) References Cited

U.S. PATENT DOCUMENTS

| | | | |
|---|---|---|---|
| 2,651,327 | A | 9/1953 | Larkin |
| 4,323,914 | A | 4/1982 | Berndlmaier et al. |
| 5,000,256 | A | 3/1991 | Tousignant |
| 5,161,090 | A | 11/1992 | Crawford et al. |
| 5,199,165 | A | 4/1993 | Crawford et al. |

(Continued)

FOREIGN PATENT DOCUMENTS

DE      4106185      9/1992

OTHER PUBLICATIONS

U.S. Appl. No. 15/993,137, filed May 30, 2018 Titled: "Prime Air-Liquid Metal Thermally Conductive Vibration Isolation Connector".

(Continued)

*Primary Examiner* — Claude J Brown
(74) *Attorney, Agent, or Firm* — Kilpatrick Townsend & Stockton LLP

(57) ABSTRACT

A vehicle such as an unmanned aerial vehicle (UAV) can include a heat-generating electronic device coupled with a heat exhaust element by a vibration isolating thermal connector. The thermal connector includes a first heat-conducting element configured to draw heat from the electronic device, a second heat-conducting element separated from the first heat-conducting element, and a flexible seal connected with the first and second heat-conducting elements and defining an enclosed cavity between the elements. The enclosed cavity contains a heat conducting liquid, and allows limited movement of the first and second heat conducting elements with respect to each other while maintaining thermal connection.

21 Claims, 14 Drawing Sheets

(56) References Cited

U.S. PATENT DOCUMENTS

| | | | |
|---|---|---|---|
| 5,303,644 A | 4/1994 | Held | |
| 5,365,402 A | 11/1994 | Hatada et al. | |
| 5,561,590 A | 10/1996 | Norell et al. | |
| 5,572,404 A | 11/1996 | Layton et al. | |
| 6,016,006 A | 1/2000 | Kolman et al. | |
| 6,037,658 A | 3/2000 | Brodsky et al. | |
| 6,392,890 B1 | 5/2002 | Katchmar | |
| 6,809,937 B2 * | 10/2004 | Augustin | H05K 3/301 174/256 |
| 7,063,127 B2 | 6/2006 | Gelorme et al. | |
| 7,218,000 B2 | 5/2007 | Houle | |
| 7,554,190 B2 | 6/2009 | Macris et al. | |
| 8,014,150 B2 | 9/2011 | Campbell et al. | |
| 8,174,830 B2 | 5/2012 | Lower et al. | |
| 10,399,190 B2 | 9/2019 | North et al. | |
| 10,643,924 B1 | 5/2020 | Shen | |
| 2005/0061474 A1* | 3/2005 | Gelorme | H01L 23/433 165/80.2 |
| 2010/0195074 A1* | 8/2010 | Sogard | F24S 40/55 355/67 |
| 2011/0149518 A1 | 6/2011 | Salamon et al. | |
| 2013/0214406 A1* | 8/2013 | Schultz | H01L 25/0655 257/713 |
| 2016/0044824 A1 | 2/2016 | North et al. | |
| 2018/0170553 A1* | 6/2018 | Wang | B64D 13/006 |
| 2019/0368826 A1 | 12/2019 | Flowers | |

OTHER PUBLICATIONS

PCT/US2019/033548, "International Search Report and Written Opinion", dated Sep. 24, 2019, 11 pages.

* cited by examiner

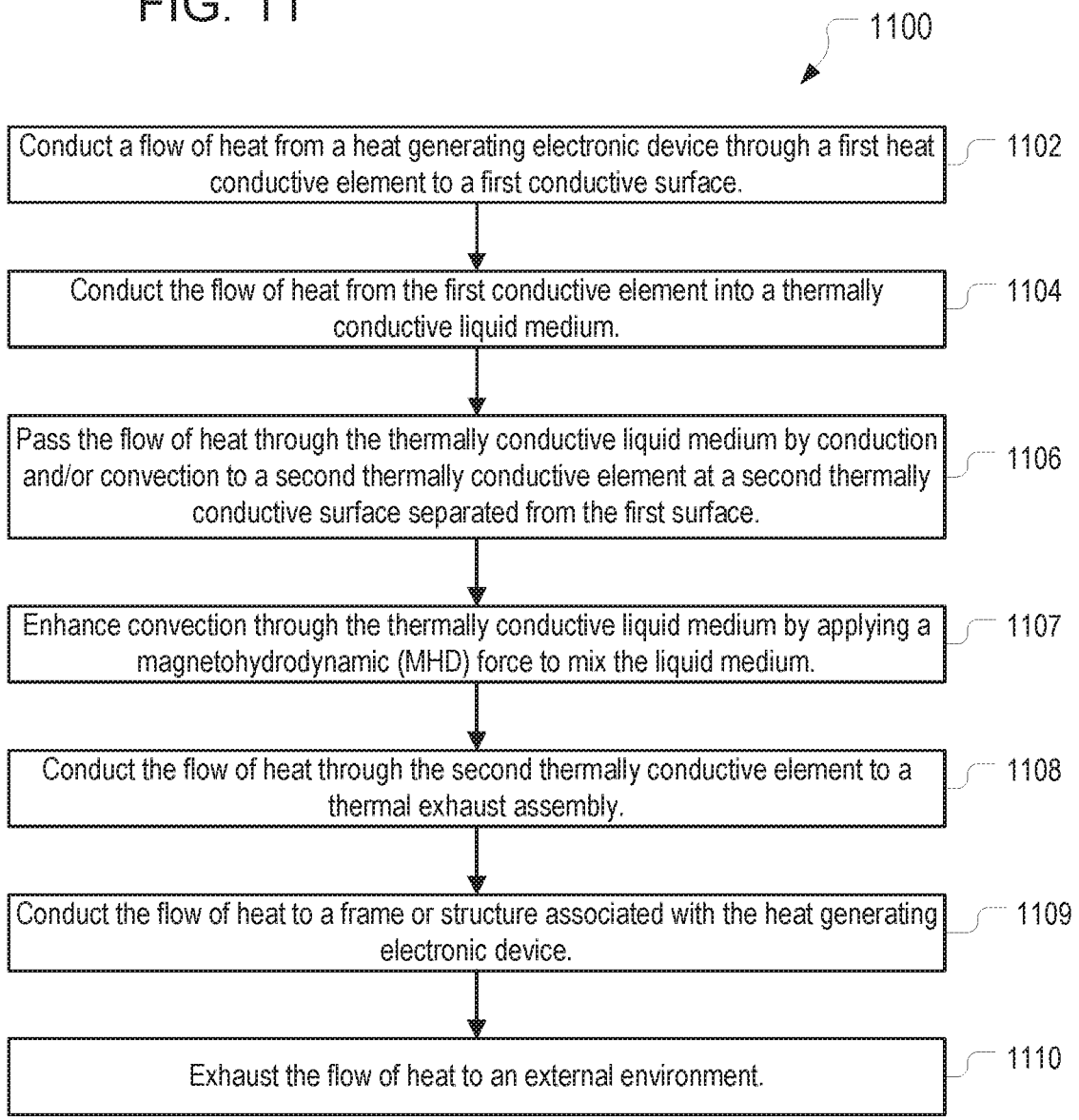

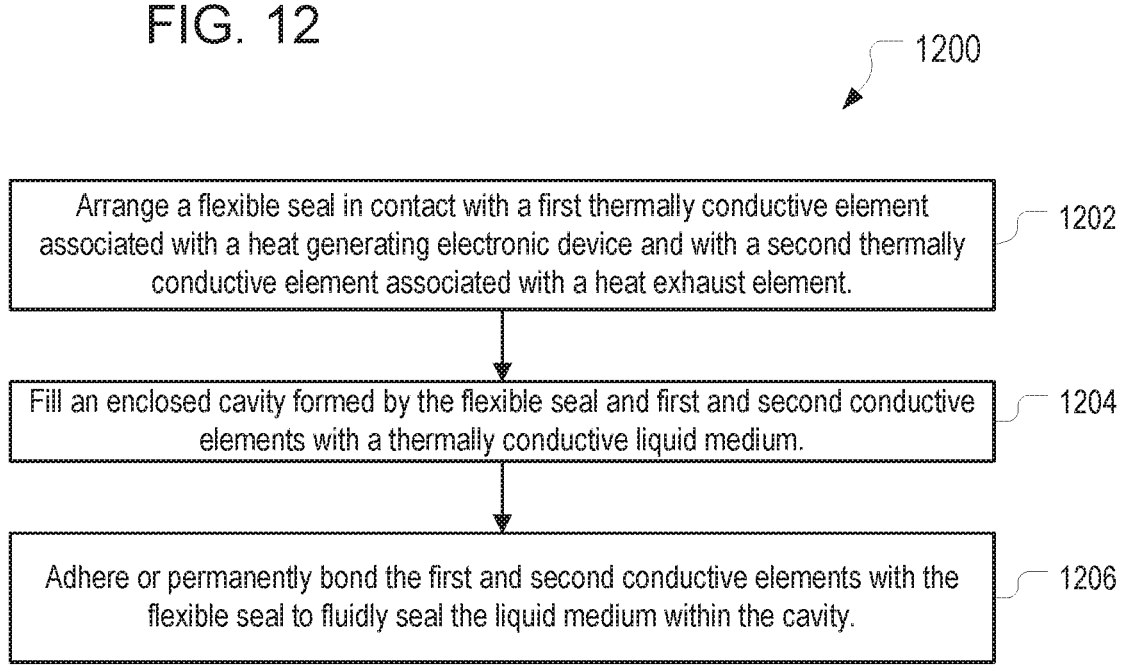

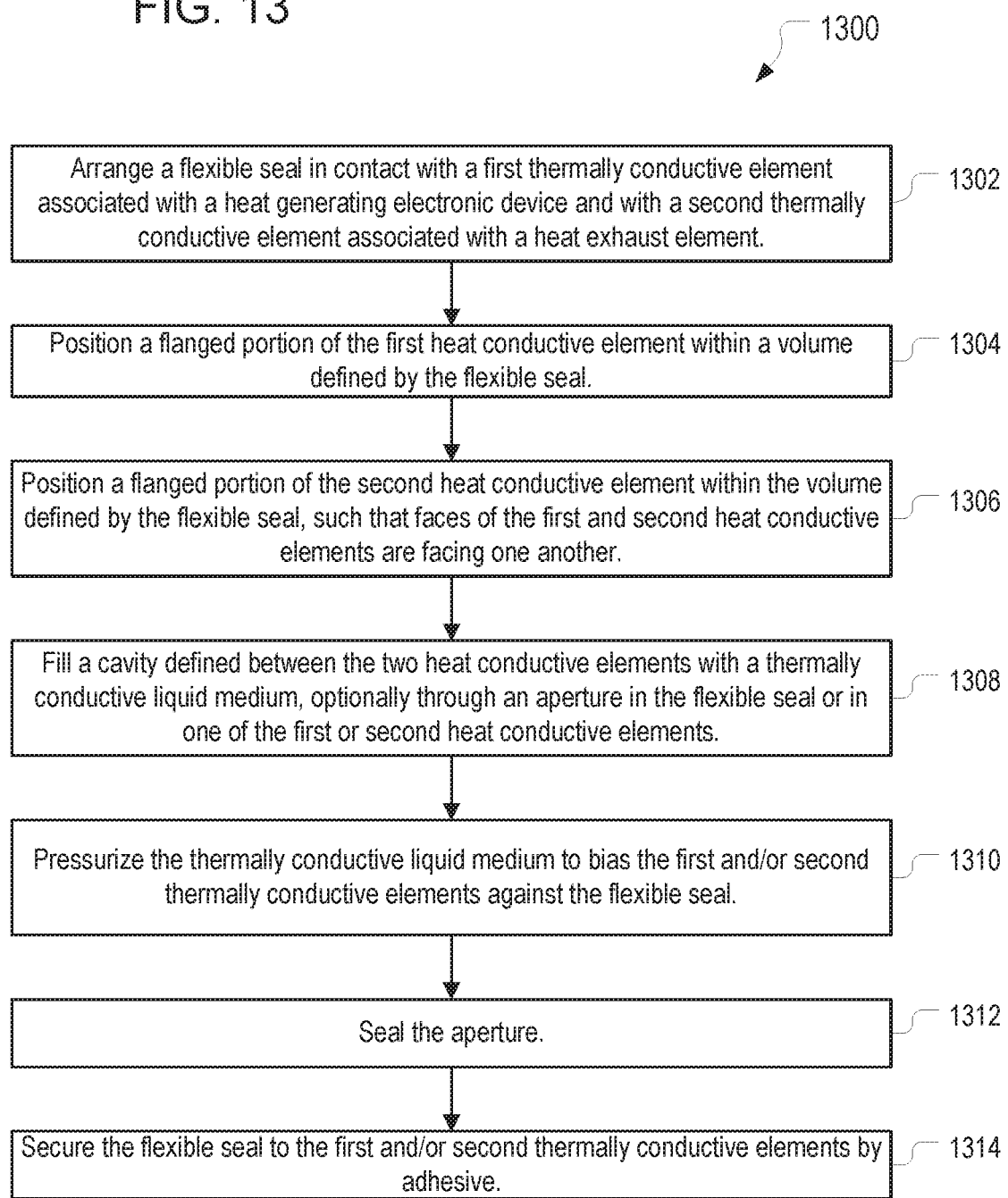

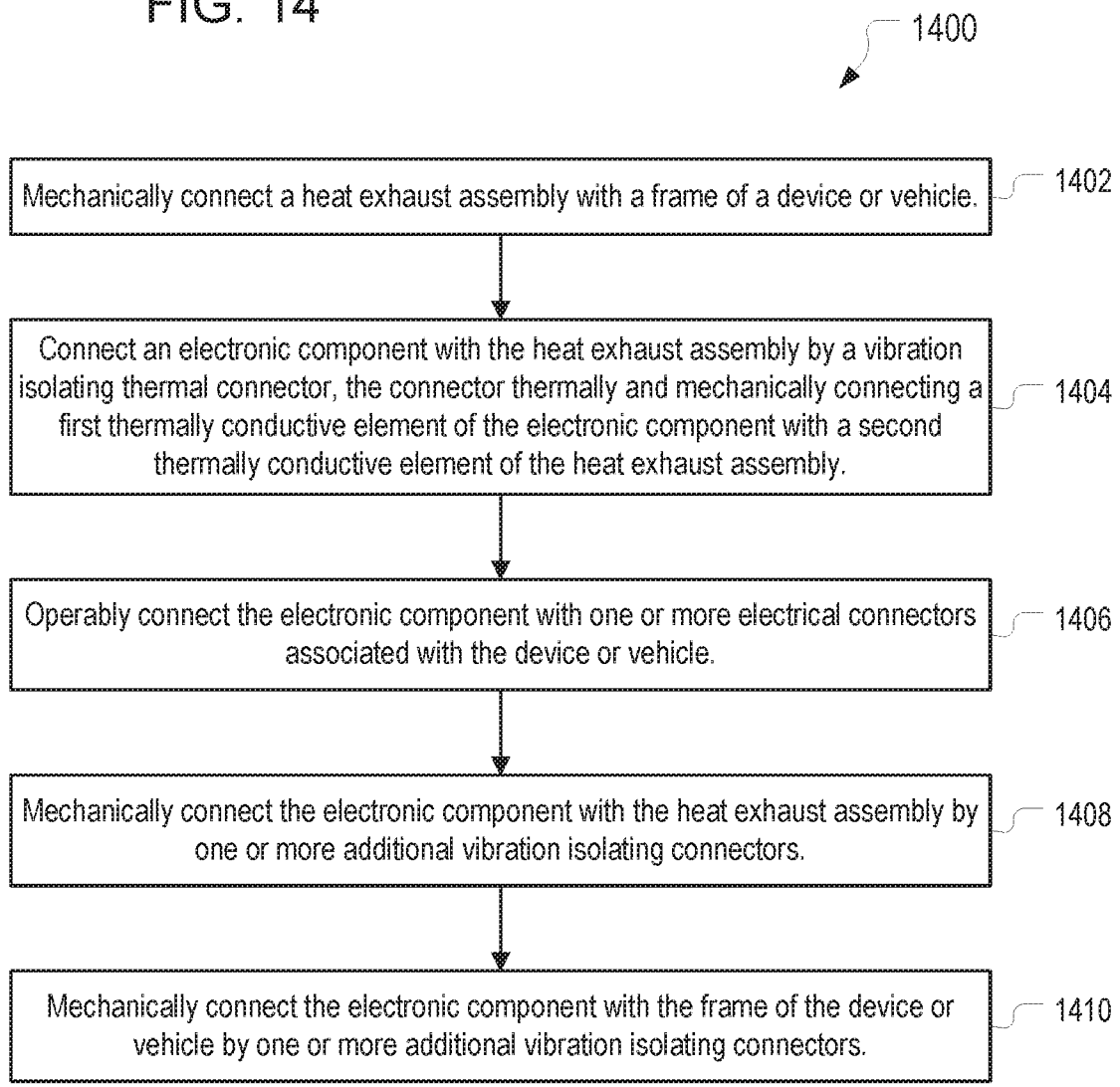

VEHICLE WITH VIBRATION ISOLATED ELECTRONICS

BACKGROUND

Computerized control is now commonplace in a wide variety of applications, including personal and industrial tasks including personal transportation, commercial transportation, entertainment, and industry. To that end, many consumer, commercial, and industrial devices and systems include embedded electronics in the form of integrated circuit boards or processing units. Some examples include vehicles, such as consumer automotive vehicles, remote-controlled or semi-autonomous vehicles and robotics, or unmanned aerial vehicles (UAV). UAVs may have significant applications in personal use (e.g., for entertainment) but may also have significant commercial applications as platforms for videography, for moving inventory in supply chain facilities, or even for carrying parcels in commercial delivery. The internal electronics of a UAV, and particularly the thermal connections that dissipate heat from their control elements, can be sensitive to shock or vibration that may occur when the UAV is under power, landing, or undergoing impact. Similar issues can affect many other types of systems, robotics, portable devices, computers, or vehicles that experience routine shock or vibration. Therefore, improved techniques for handling shock and vibration for thermal waste management from electronics are needed.

BRIEF DESCRIPTION OF THE DRAWINGS

Various embodiments in accordance with the present disclosure will be described with reference to the drawings, in which:

FIG. 11 illustrates an example process for venting heat from an electronic device using a thermally conductive vibration isolating connector;

FIG. 12 illustrates a first example process for assembling a thermally conductive vibration isolating connector;

FIG. 13 illustrates a second example process for assembling a thermally conductive vibration isolating connector; and FIG. 14 illustrates an example process for assembling a controller with a device or vehicle using a thermally conductive vibration isolating connector.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments described herein are directed to a thermally conductive vibration isolating connector for decoupling sensitive electronic components from high vibration parts or from shock while maintaining a good thermal connection. As an example, the connector utilizes liquid metal encapsulated within a fluid tight seal to prevent leakage, in order to connect a heat spreading portion of a central processing unit with a heat sink or similar exhaust assembly. The connector can be used in a variety of specific applications where sensitive heat-generating electronics are used as controllers or components of industrial or commercial systems that are subject to shock or vibration, or in consumer electronics such as portable wireless devices, drones, UAV's, or the like.

Figure 1:
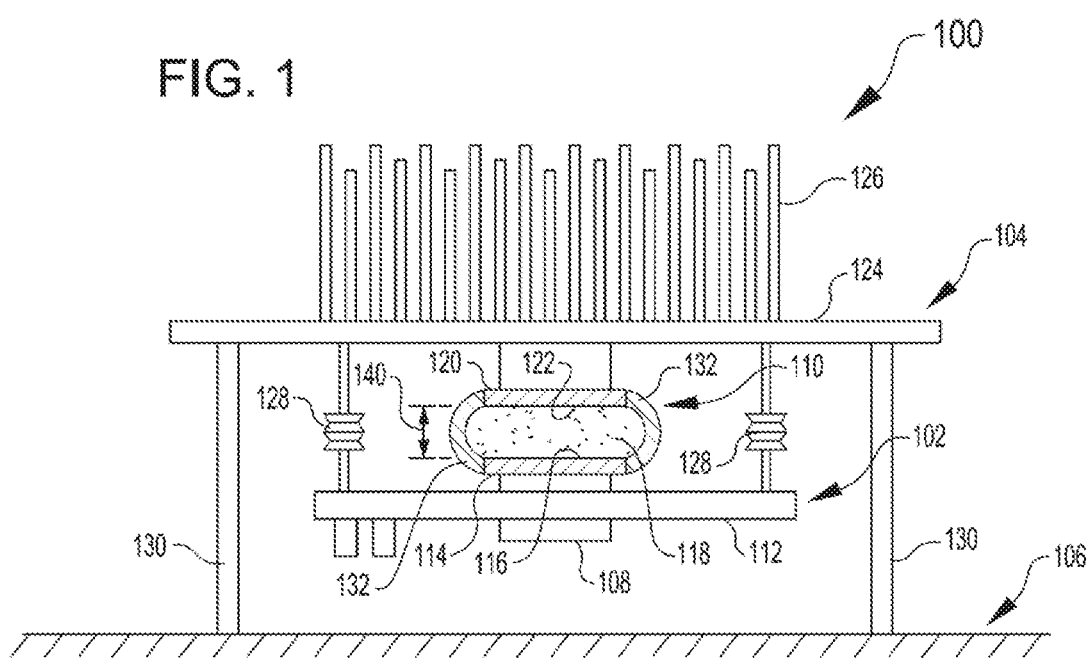
FIG. 1 is a cross sectional schematic view showing a first example of an assembly of a heat-generating electronic component with a heat exhaust component by a thermally conductive vibration isolating connector, in accordance with at least one embodiment of the present disclosure.

FIG. 1 is a cross sectional schematic view showing a first example of an assembly 100 of a heat-generating electronic component 102 with a heat exhaust component 104 connected by a thermally conductive vibration isolating connector 110, in accordance with at least one embodiment of the present disclosure. As shown, the heat exhaust component 104 is connected, via fixed connectors 130, with a frame or support 106; and the electronic component 102 is suspended from the heat exhaust component 104. Suitable supports 106 depend on the specific application for which the electronic component 102 is used, and can include but are not limited to: surfaces or structural elements of vehicles, computer casings, server casings or cabinets, mobile devices such as cell phones, laptops, tablets, industrial equipment, or other devices, particularly devices which may undergo shock as part of normal operation, accident, or routine wear-and-tear. In some embodiments, the heat exhaust component 104 may be connected with components in its environment by alternative mechanical connectors, such as dampening or soft connectors, spring assemblies, or other suitable vibration-dampening or compressible elements.

The heat generating electronic component 102 generates heat which is passed through the thermally conductive vibration isolating connector 110 and ultimately exhausted to an external environment by the heat exhaust component 104. Specific examples of the heat generating electronic component include, but are not limited to, integrated circuit boards (ICB) for consumer electronics such as computers, tablets, phones, wearable devices, personal UAV's or drones, or commercial and industrial systems. The vibration isolating connector 110 can be combined with a wide variety of specific heat generating electronic components 102 and heat exhaust components 104.

According to various embodiments, the thermally conductive vibration isolating connector 110 includes a first thermally conductive element 120, which can be thermally connected with the heat exhaust element 104, and a second thermally conductive element 114, which can be thermally connected with the processor 108 or other hot component of the heat generating electronic component(s). The second and first thermally conductive elements 114, 120 are thermally connected with each other by a fluid-filled cavity 118 containing a thermally conductive liquid contained by a flexible outer seal 132. The flexible seal 132 allows a gap 140 between the second and first thermally conductive elements 114, 120, thus allowing the electronic component 102 to move with at least some independence from the heat exhaust component 104.

The thickness of this gap 140 can be tuned according to the amount of vibration or mechanical shock that the system as a whole is designed to accommodate, e.g., having a thickness on the order of at least the highest expected amplitude of vibration. By allowing the gap to change in thickness, the thermally conductive vibration isolating connector 110 allows for mechanical isolation between the heat generating electronic component 102 and heat exhaust element 104 that is a quantum improvement in any incidental damping achieved by conventional thermal connectors like thermal paste, solder, or the like, all of which require a rigid connection between a processor and heat sink. In various embodiments, the gap 140 can be on the order of 5 mm to 15 mm, preferably about 10 mm. The specific dimensions of the gap 140 can be increased or decreased depending on the surface area available for heat transfer on the first and second working surfaces 122, 116, the specific thermally conductive liquid contained in the cavity 118, and the anticipated heat load of the heat generating electronic component 102.

The flexible seal 132 allows limited motion of the second and first thermally conductive elements 114, 120 relative to each other. In various embodiments, the flexible seal 132 allows the gap 140 to compress or extend from 10% up to 150% of its resting state in response to shock, vibration or load, depending on the application for which it is designed. For example, in specific embodiments, the flexible seal 132 can allow the gap to compress or extend by at least 10%, by at least 30%, or by at least 50%. In some embodiments, the flexible seal 132 can also allow transverse motion of the second and first thermally conductive elements 114, 120 relative to each other of up to 50% of the thickness of the gap 140, or can allow tilting or rolling motion of one conductive element relative to the other, up to a deflection at either end of up to 150% extension or compression relative to the initial gap. In specific embodiments, the flexible seal 132 can allow extension of at least 10%, 30%, 50%, or 150%; or can allow compression of at least 10%, 30%, 50%, or 500%. Suitable rubber materials for the flexible seal 132 include, but are not limited to, polydimethylsiloxane (PDMS).

The thermally conductive liquid contained in the cavity 118 is preferably a liquid metal or liquid metal alloy with high thermal conductivity. Suitable materials can include liquid media with thermal conductivities of at least 2 $Wm^{-1}K^{-1}$, at least 5 $Wm^{-1}K^{-1}$, or at least 8.5 $Wm^{-1}K^{-1}$. In some embodiments, the thermally conductive liquid has a thermal conductivity of at least 16 $Wm^{-1}K^{-1}$. The specific selection of thermally conductive liquid can depend on the required shock protection, with higher thermal conductivities enabling the use of a wider gap between the thermally conductive elements 114, 120, and thus allowing greater vibration isolating potential.

Suitable thermally conductive liquids can include known elemental metals with a melting point below the operating temperature of a computer (i.e., less than about 100° C., less than 80° C., or less than 60° C.), or with a melting point at room temperature or less so that the thermally conductive material remains liquid when the connected device is turned off (i.e., less than 20° C., less than 10° C.). Suitable liquid metals can include, e.g., elemental mercury, liquid mercury alloys, or similar liquid metals and liquid metal alloys. In various embodiments, the thermally conductive liquid is a liquid metal alloy such as, but not limited to, GALINSTAN (RG Medical Diagnostics, Wixom, Mich., USA), other gallium eutectic alloys (e.g., Gallium, Indium Eutectic alloys), other non-toxic liquid metal alloys, or other suitable liquid metal alloys with melting points less than or equal to 20° C.

In some embodiments, the thermally conductive liquid contained in the cavity 118 is thermally conductive and/or convective suspension of particulates in a liquid media, e.g., $H_2O$ or oil. Suitable particulate suspensions for increasing thermal conductivity include, but are not limited to: diamond, gold, and silver micro- or nano-particles in either water or oil. In some embodiments with low heat load requirements, oil or water without suspended particulates may be used.

The second and first thermally conductive elements 114, 120 can be integrally connected with the heat-generating electronic element 102 and/or heat exhaust element 104, respectively; or one or the other of the elements can be attached by an intermediate thermally connector. For example, in embodiments where the heat generating element 108 is a processor, a heat spreading surface of the processor can be the second thermally conductive element 114. The specific geometries of the electronic element 102, heat exhaust element 104, and the thermally conductive elements 114, 120 can vary depending on the form factor of the components used.

The thermally conductive elements 114, 120 include first and second working surfaces 122, 116, respectively, that contact the fluid-filled cavity 118 and this interface with the thermally conductive liquid. The outer seal 132 can be positioned and connected with one or the other of the working surfaces 116, 122, or can be connected with the thermally conductive elements 114, 120 at an offset from the working surfaces. Various configurations are described below with reference to specific embodiments.

The working surfaces 116, 122 can be the same material as a remainder of the thermally conductive elements 114, 120, or can be a different material deposited, welded, or otherwise fixed to the thermally conductive elements for, e.g., protecting the elements from damage such as corrosion by the thermally conductive liquid contained in the cavity 118. For example, the working surfaces 116, 112, can include a protective coating including one or more of, but not limited to: graphite, graphene, cubic boron, zinc, diamond, amorphous carbon, or other comparable material. For embodiments using liquid media containing suspended particles, or other media that exclude liquid metals, nonreactive thermally conductive metals such as gold, platinum, palladium, or the like can also be used as protective coatings. Such protective coatings can be assembled with the working surfaces 116, 122 by any suitable form of thin-layer deposition such as vapor deposition, and can be very thin, e.g. nanometer-scale thickness, so as to minimally impact thermal conductivity. In some embodiments, the working surface can be a resilient thermally conductive metal, such as nickel, with or without a protective layer.

Figure 2:
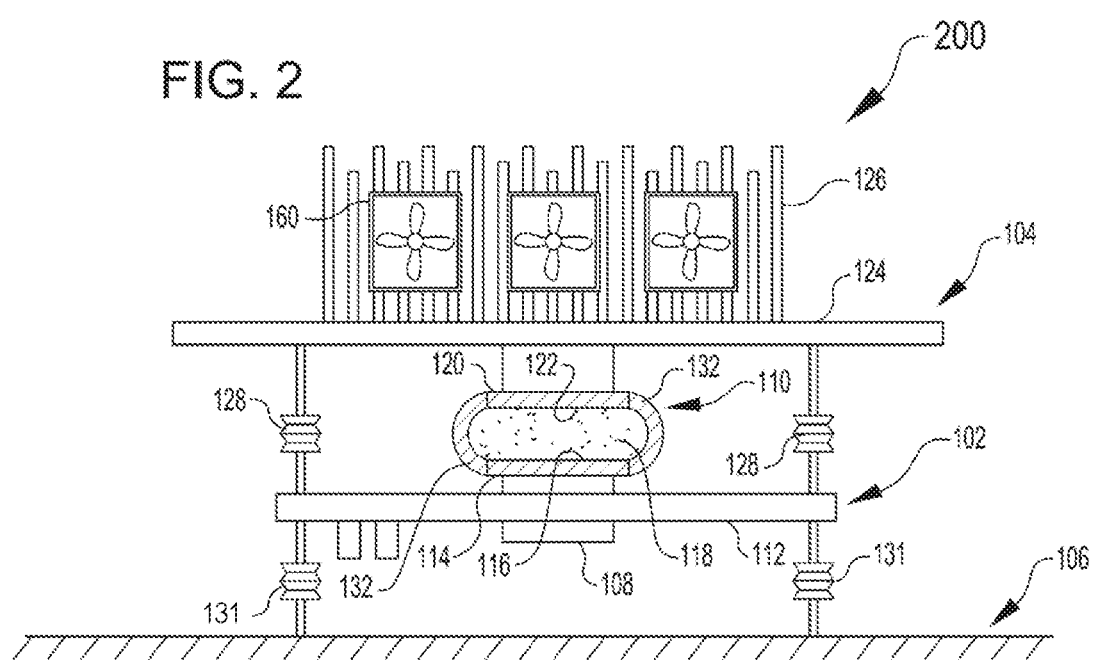
FIG. 2 is a cross sectional schematic view showing a second example of an assembly of a heat-generating electronic component with a heat exhaust component by a thermally conductive vibration isolating connector.
Figure 3:
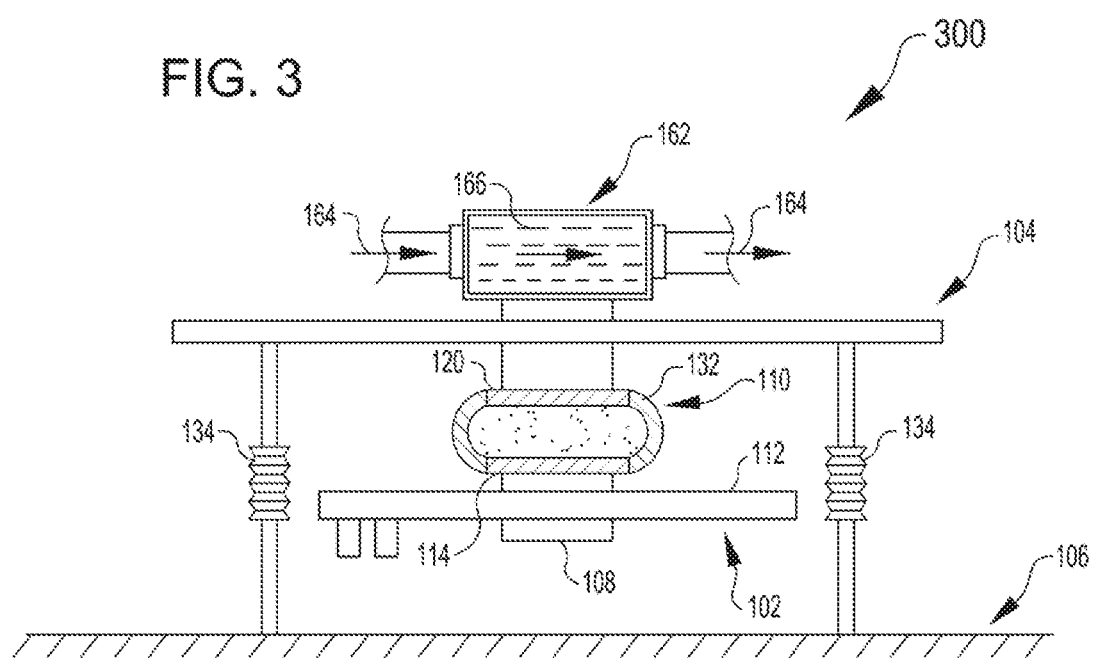
FIG. 3 is a cross sectional schematic view showing a third example of an assembly of a heat-generating electronic component with a heat exhaust component by a thermally conductive vibration isolating connector.

The electronic component 102 is shown herein suspended from the heat exhaust component 104 by a set of vibration isolating connectors 128, while the heat exhaust component is mounted by fixed connectors 130 to a frame or support 106, which may be a casing, e.g. of a computer enclosure, a vehicle, a robot, a UAV, or other system configured for use with the electronic component. Various other configurations of supplemental supports can be used in conjunction with the vibration isolating connector 110, depending on such factors as the weight-bearing capacity of the specific vibration isolating connector, the weight of the electronic component 102, the amount of shock or vibration that the system or vehicle as a whole is designed to withstand, or other similar factors. Various other configurations of optional connectors are shown in FIGS. 2-3. In some embodiments, the electronic component 102 can be suspended from the heat exhaust component 104 by the thermally conductive vibration isolating connector 110 alone, or the electronic component may be positioned above the heat exhaust component and supported by the thermally conductive vibration isolating connector in compression, or in a variety of other configurations and orientations.

The heat exhaust component 104 can include any one, or more, of a variety of heat transfer and exhaust structures, such as heat sinks. In one example, as shown, the heat exhaust component 104 can include or be composed of a thermally conductive material (e.g. Cu, Al, etc.) and include a high surface-area element 126 such as an array of heat-conductive fins positioned on an outer surface 124 of the heat exhaust component 104, which are known in the art. Various known methods and devices for exhausting heat may be substituted, such as but not limited to, passive airflow heat sink/heat exhaust assemblies, active fan-driven heat sink/heat exhaust assemblies, convective liquid heat sink/heat exhaust assemblies, or the like.

Alternative constructions of the heat generating component 102, heat exhaust component 104, and thermally conductive vibration isolating connector 110 with respect to a frame 106 are described below with reference to FIGS. 2-3. Aspects of each construction 100, 200, 300 may be combined except where expressly contraindicated.

FIG. 2 is a cross sectional schematic view showing a second example of an assembly 200 of a heat-generating electronic component 102 with a heat exhaust component 104 by a thermally conductive vibration isolating connector 110. In this second assembly 200, the heat exhaust component 104 is an active convection heat sink assembly including one or more fans 160 positioned to push air through the heat exhaust fins 126. FIG. 2 also shows an optional configuration of vibration isolating connectors 128, 131, or shock absorbing connectors, which can directly connect the electronic component 102 with the frame 106 (connectors 131) as well as connect the electronic component with the heat exhaust component 104 (connectors 128). Such configurations may be used to increase the stability of the electronic component 104 relative to the frame 106, while still reducing the impact of shock or vibration on the thermal connection between the heat generating element 108 and heat exhaust component 104.

FIG. 3 is a cross sectional schematic view showing a third example of an assembly 300 of a heat-generating electronic component 102 with a heat exhaust component 104 by a thermally conductive vibration isolating connector 110. In this third assembly 300, the heat generating electronic component 102 is suspended from the heat exhaust component 104 and supported by the thermally conductive vibration isolating connector 110 without additional supports. The heat exhaust component 104 is shown suspended from the frame 106 by vibration isolating connectors 134, but these may be omitted depending on the application and depending on the resiliency of the connector 110 and weight of the electronic component 102. Also shown is an alternative active heat exhaust assembly 162 including a working fluid 166 connected by way of pipes 164 to draw heat from the heat exhaust component 104 by liquid cooling.

Various specific configurations of the thermally conductive vibration isolating connector 110 can be used in any of the embodiments of thermally conductive vibration isolating assemblies described herein. Several specific embodiments are described in detail below with reference to FIGS. 4-7, but it will be understood that various combinations of the features described herein and alternative constructions are within the scope of this disclosure. In the following figures, like parts are enumerated using similar numbering.

Figure 4:
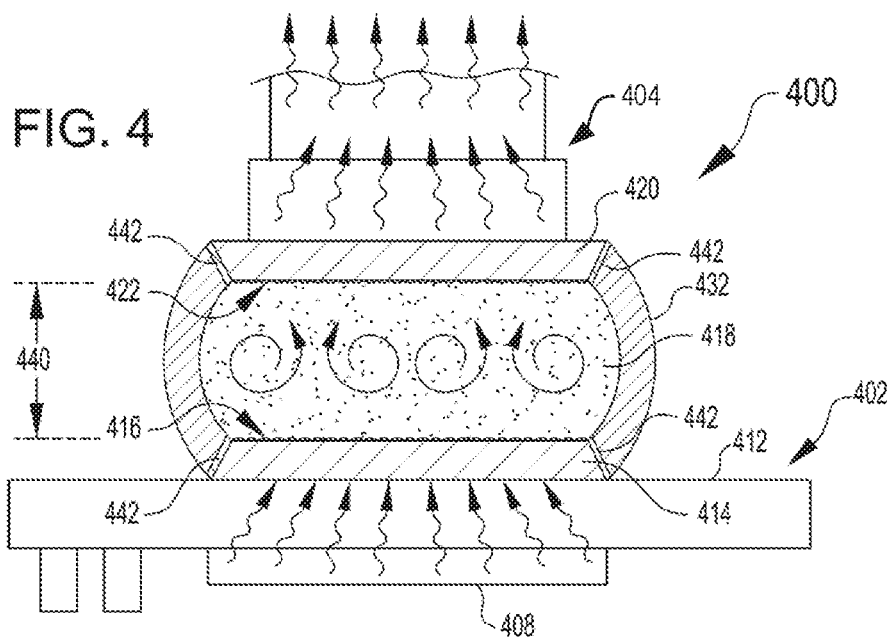
FIG. 4 is a detailed cross sectional view showing a first exemplary embodiment of a thermally conductive vibration isolating connector with an adhered seal in the context of a generic heat source and heat sink.

FIG. 4 is a detailed cross sectional view showing a first exemplary embodiment of a thermally conductive vibration isolating connector 400 with an adhered seal 432 in the context of a generic heat source 402 and heat sink 404. The heat source 402 includes a heat generating component 408, such as a processor or the like, which conducts heat to a second thermally conductive element 414. As described above, the second thermally conductive element 414 can be a heat spreading portion of the heat generating component 408, or can be a heat spreading component directly or otherwise thermally connected with the heat generating component 408 of an integrated circuit board 412 or similar device. Similarly, the first thermally conductive element 420 can be a conductive portion of the heat sink 404, or can be directly or thermally connected to the heat sink. The heat sink can include any suitable apparatus for exhausting heat to an external environment, but is shown herein as conducting heat away from the connector 400.

The first and second thermally conductive elements 420, 414 are separated by a liquid-filled enclosed cavity 418 bounded by a flexible seal 432, and defining a gap 440 between the elements. The gap 440 separates first and second thermally conductive surfaces 422, 416 which may optionally include a protective coating. The cavity 418 is filled with a thermally conductive liquid medium as described above. In some embodiments, the contained liquid medium conducts heat primarily by conduction, primarily by convection, or by a combination of both conduction and convection. In accordance with at least one embodiment, the seal 432 is connected with each of the second and first thermally conductive elements 414, 420 by an adhesive 442. The adhesive can be, e.g., a polymer adhesive, such as but not limited to silicone adhesive. The seal 432 can be adhered to each of the conductive elements 414, 420 along the conductive surfaces 416, 422, adjacent the surfaces, or at a remove from the surfaces, provided the seal encloses the fluid-filled cavity 418. According to some embodiments, either or both of the first and second thermally conductive elements 420, 414 can be bonded to the flexible seal 432, e.g. during manufacture of the seal, so that the seal and thermally conductive element or elements are permanently attached. For example, in some cases the flexible seal 432 can be bonded to the first and/or second heat conductive elements by an epoxy coating or similar.

Figure 5:
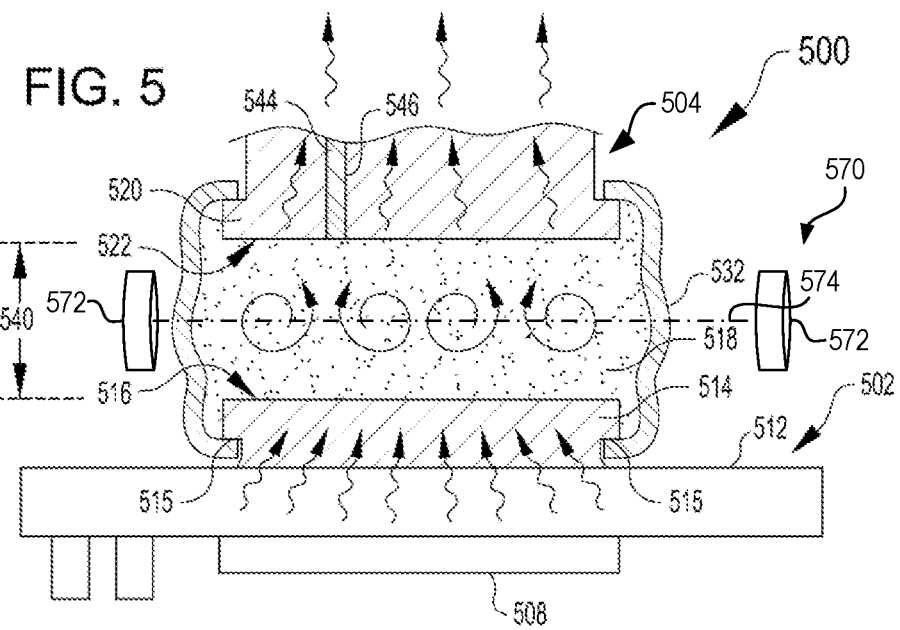
FIG. 5 is a detailed cross sectional view showing a second exemplary embodiment of a thermally conductive vibration isolating connector with an integral seal in the context of a generic heat source and heat sink.

FIG. 5 is a detailed cross sectional view showing a second exemplary embodiment of a thermally conductive vibration isolating connector 500 with an integral seal 532 in the context of a generic heat source 502 and heat sink 504. A first thermally conductive element 520 draws the heat from the enclosed cavity 518 and conducts it away from the connector 500. The heat source 502, as above, includes a heat generating component 508 of an integrated circuit board 512 or similar device, and a second thermally conductive element 514 that draws heat from the heat generating component.

The seal 532 is arranged to contact flanged portions 515 of the second and first thermally conductive elements 514, 520, so that pressure within the enclosed cavity 518 causes the second and first thermally conductive elements to press outward away from one another and to more tightly seal the enclosed cavity. In some embodiments, the seal 532 may be integrally formed with the first and second conductive elements 520, 514, i.e. deposited and/or cured around a preassembly of the conductive elements prior to the insertion of the thermally conductive liquid medium. Once assembled, the cavity 518 can be filled by the injection of the thermally conductive liquid medium through an aperture 546 in either one of the first and second conductive elements 520, 514, or through the seal 532, which is then closed by way of a sealant 544. The seal 532 can include shaped walls to better enable compression or elongation in response to shock or vibration, and the seal can also be adhered with one or both of the thermally conductive elements 514, 520.

In some alternative embodiments, the thermally conductive vibration isolating connector 500 may be connected with, or mounted in conjunction with, a magnetohydrodynamic (MHD) mixing device 570. The mixing device 570 includes one or more, preferably two, electrostatic elements 572 arranged adjacent the enclosed cavity 518. In some embodiments, the mixing device includes two electrostatic elements 572 such as coils or solenoids arranged on opposite sides of the cavity 518 along an axis 574 passing through or adjacent to the cavity. The electrostatic element(s) 572 are operable to generate an electromagnetic field that penetrates the cavity 518 and, in the presence of magnetically sensitive liquid metals, metal particles, or ions, induces an uneven body force within the cavity on the contained liquid that induces further mixing, which enhances convective heat transfer. The electrostatic element(s) 572 can be positioned at any suitable orientation relative to the cavity 518, including alongside the cavity as shown (i.e. not interfering with the heat source 502 or heat sink 504), or can be positioned within the heat source and heat sink. Various types of MHD mixing devices may be used, including induction devices in which alternating currents are induced in the fluid by varying the magnetic field. It will be understood that similar MHD devices may be used in conjunction with any other embodiment of a thermally conductive vibration isolating connecter disclosed herein.

Figure 6:
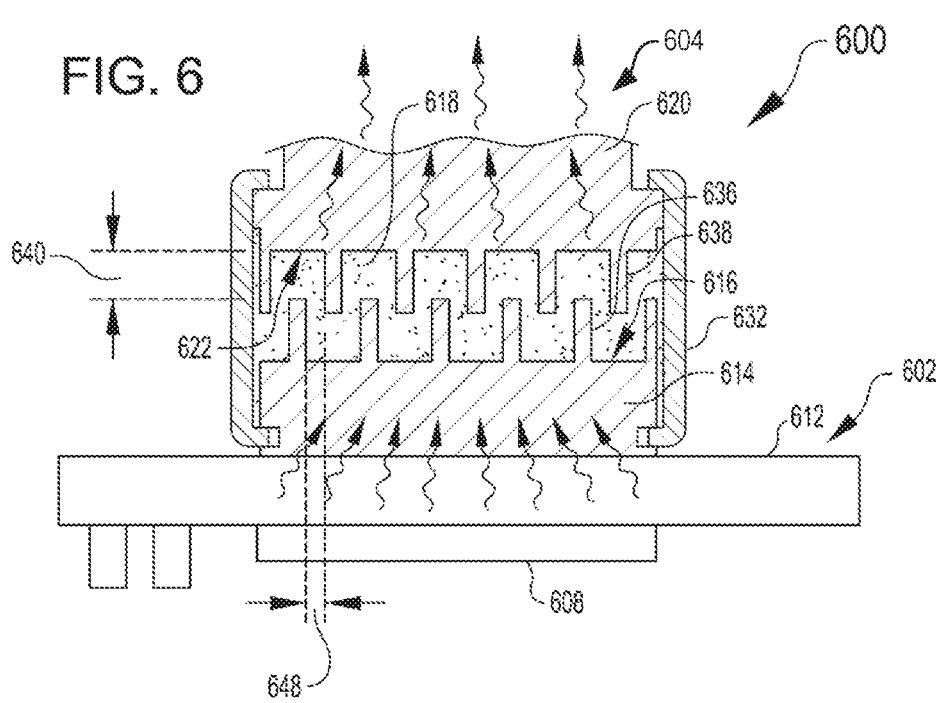
FIG. 6 is a detailed cross sectional view showing a third exemplary embodiment of a thermally conductive vibration isolating connector with high surface-area conductive elements.

In accordance with various embodiments, the thermally conductive surfaces that interact with the thermally conductive liquid medium may be modified to accelerate heat transfer. For example, FIG. 6 is a detailed cross sectional view showing a third exemplary embodiment of a thermally conductive vibration isolating connector 600 with high surface-area conductive elements 614, 620. As shown, the heat source 602 includes a heat generating component 608 of an integrated circuit board 612 or similar device, connected with a second thermally convective element 614. First and second thermally conductive elements 620, 614 are separated from one another by a gap 640, and in combination with a flexible seal 632, enclose a cavity 618 containing a thermally conductive liquid medium. A first thermally conductive element 620 draws the heat from the enclosed cavity 618 and conducts it away from the connector 600. The seal 632 is shown integrally connected with the second and first thermally conductive elements 614, 620, but may also, or alternatively, be adhered.

The first and/or second thermally conductive elements 620, 614 can include surface features 638, 636 extending from their respective thermally conductive surfaces 616, 622, which increase the effective surface area of each element and can increase the rate at which heat is exhausted through the connector 600. In some embodiments, the surface features 638 can take the form of alternating fins, teeth, grooves, or pylons. Generally, at least a minimum gap 640 is maintained to allow for compression of the connector 600. A transverse clearance 648 may also be maintained between adjacent features 636, 638 in order to allow for transverse motion between the second and first thermally conductive elements 614, 620.

Figure 7:
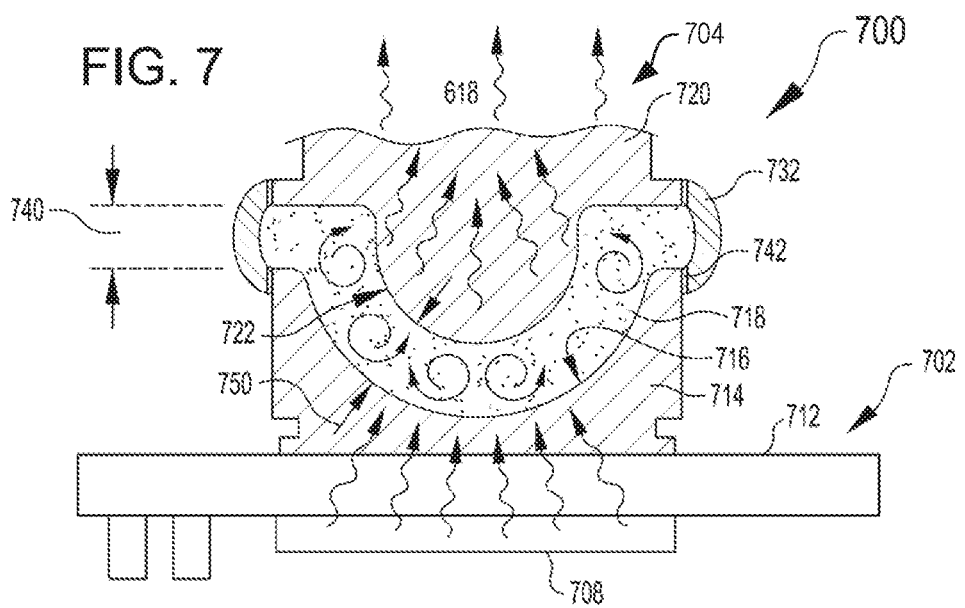
FIG. 7 is a detailed cross sectional view showing a fourth exemplary embodiment of a thermally conductive vibration isolating connector with socketing conductive elements.

The surface geometries of the thermally conductive elements may depart entirely from flat surfaces in various alternative embodiments. FIG. 7 is a detailed cross sectional view showing a fourth exemplary embodiment of a thermally conductive vibration isolating connector 700 with socketing conductive elements. Heat source 702 includes a heat generating component 708 of an integrated circuit board 712 or similar device, connected with a second thermally conductive element 714. Second and first thermally conductive elements 714, 720 are separated from one another by a gap 740, and in combination with a flexible seal 732, enclose a cavity 718 containing a thermally conductive liquid medium. A first thermally conductive element 720 draws the heat from the enclosed cavity 718 and conducts it away from the connector 700 to the heat sink 704. The seal 732 is shown adhered 742 with the first and second thermally conductive elements 720, 714, but may also, or alternatively, be integrally connected.

In accordance with at least one specific embodiment, the second and first thermally conductive elements 714, 720 employ a socketing connection, whereby the first element 720 contains the first element 714 in an approximation of a loose ball-and-socket joint. The specific geometry may vary, but generally includes a clearance 750 that allows for at least a small degree of orthogonal, transverse, and/or rotational displacement between the first and second surfaces 722, 716 of the respective first and second thermally conductive elements 720, 714.

Figure 8:
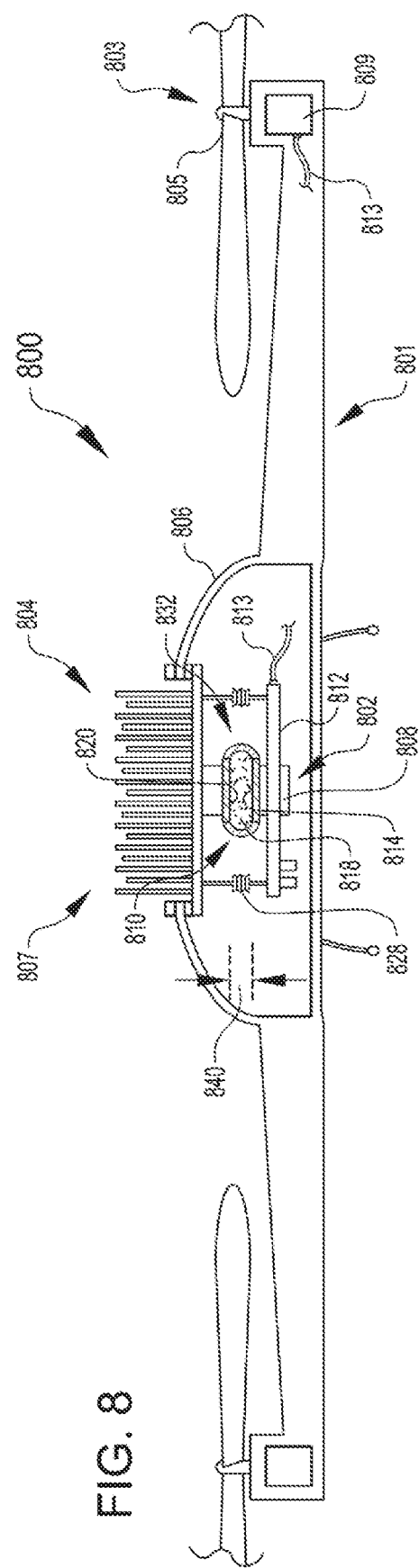
FIG. 8 is a cross sectional schematic view of a first example of an unmanned aerial vehicle (UAV) employing a thermally conductive vibration isolating connector to support controller electronics with an exposed thermal exhaust element.
Figure 9:
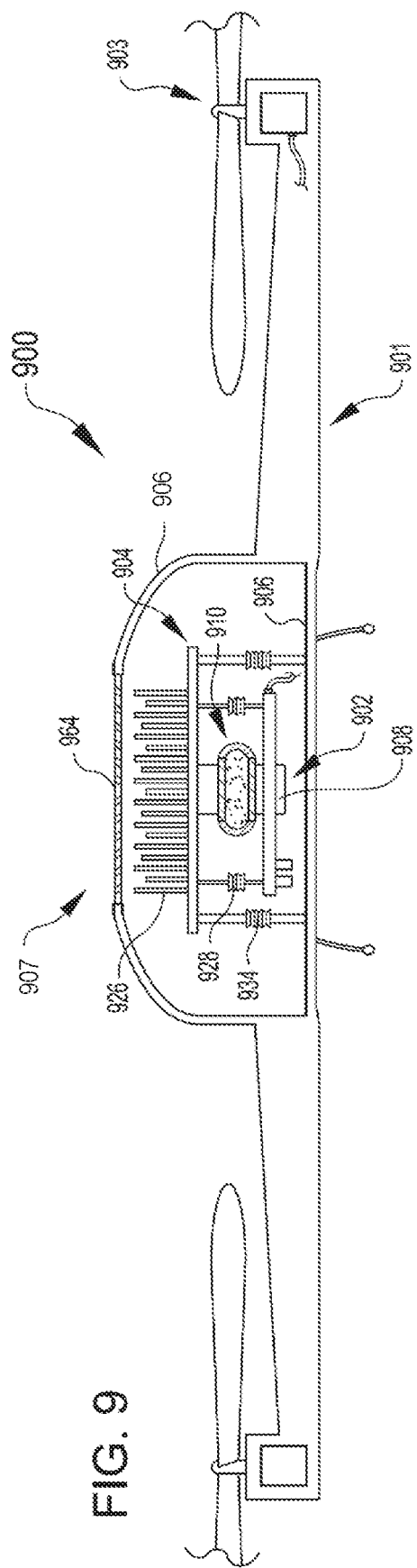
FIG. 9 is a cross sectional schematic view of a second example of a UAV employing a thermally conductive vibration isolating connector to support controller electronics with an internal thermal exhaust element.
Figure 10:
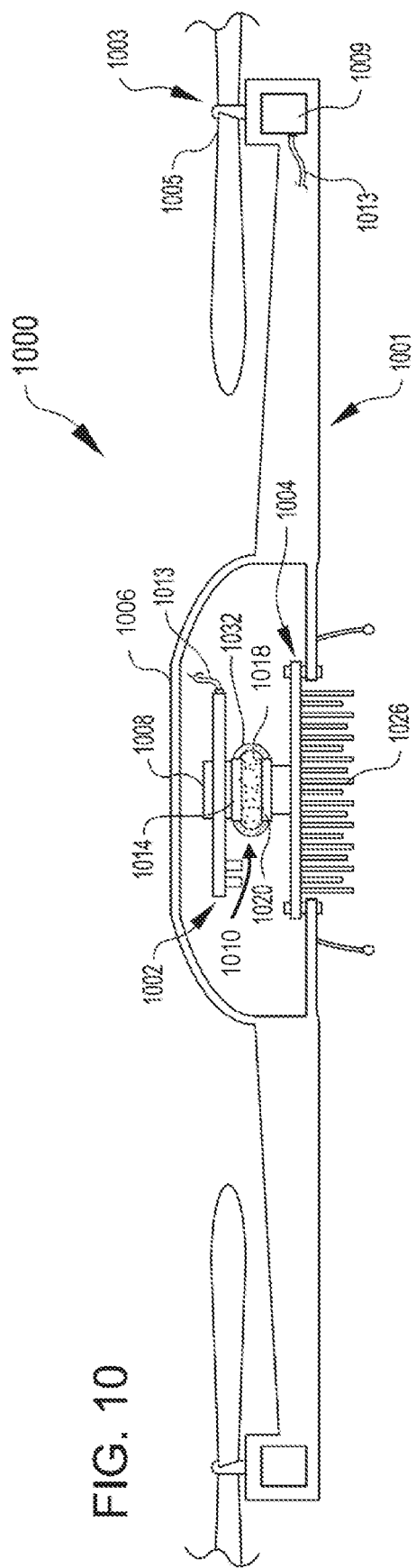
FIG. 10 is a cross sectional schematic view of a third example of a UAV employing a thermally conductive vibration isolating connector to support controller electronics with an exposed thermal exhaust element in a reversed orientation.

The various embodiments of thermally conductive vibration isolating connectors described herein may be applied to any suitable device, system, or vehicle as described above, and particularly for uses in which routine vibration or shock resistance is beneficial to prolonging the service life of the device, system, or vehicle. One non-limiting example of such a device is a UAV, which has applications in both private and commercial use. FIGS. 8-10 illustrate specific embodiments of UAV's employing thermally conductive vibration isolating connectors to protect their onboard electronics, but it will be readily understood that such devices can be employed to protect the electronics that control aspects of various other devices, vehicles, and industrial systems as well.

FIG. 8 is a cross sectional schematic view of a first example of an unmanned aerial vehicle 800 employing a thermally conductive vibration isolating connector 810 to support controller electronics 802 with an exposed thermal exhaust element 804. The UAV 800 includes a frame 801, thrust elements 803 including propellers 805 and motors 809, and a controller 802 operably (i.e., electrically) connected with the motors by way of electrical connections 813. Additional elements of the UAV are omitted for clarity, but the controller 802 will typically include electrical connections for control or monitoring of a variety of features.

A first thermally conductive element 820 is thermally connected with the heat exhaust component 804, which is shown herein exposed through an opening 807 in the central body 806 of the frame 801. The controller electronics 802, typically an integrated circuit board (ICB) 812, includes a heat generating component 808 that is connected with the second thermally conductive element 814. The controller electronics 802 and associated thermally conductive element 814 are shown centered for clarify, and may differ greatly in size from those pictured, and may be located at any suitable location on the UAV 800, including, e.g., near one of the thrust elements 802, or elsewhere.

The heat exhaust component 804 can be connected directly with the body frame 801, and the controller electronics 802 can be suspended from the heat exhaust component by way of the thermally conductive vibration isolating connector 810, as well as optional vibration isolating connectors 828. In this and similar arrangements, the controller electronics 802 have a limited degree of freedom to move relative to the frame 801 so that vibrations associated with operation of the UAV 800, shock associated with routine landing and takeoff, and even shock associated with crash landing or collisions, can be mitigated by shock and vibration absorption by the thermally conductive vibration isolating connector 810 and/or by the vibration isolating connectors 828. This arrangement differs markedly from conventional systems, in which heat exhaust components are typically rigidly tied to their respective heat-generating components. By removing rigid connections between the controller electronics 802 and the heat exhaust component 804, the effective mass of the controller electronics is greatly decreased, and the amount of shock absorption needed to protect the controller electronics is also greatly decreased.

Placing the heat exhaust element 804 in direct connection with the external environment can improve the efficiency with which the UAV 800 sheds heat produced by the controller electronics 802. However, in various embodiments, the heat exhaust components can be protected from the elements. For example, FIG. 9 is a cross sectional schematic view of a second example of a UAV 900 employing a thermally conductive vibration isolating connector 910 to support controller electronics 902 with an internal thermal exhaust element 904. The UAV 900 includes a frame 901, thrust elements 903, and a controller 902 operable to control operation of the UAV. The heat exhaust element 904 and the controller electronics 902 can both be protected within the body 906 of the UAV, and the heat exhaust features 926 of the heat exhaust component can be internal to the body 906, which can optionally include one or more air vents or intakes 964 for providing cooling air. In addition, various configurations of vibration isolating connectors can be used for mechanically isolating the controller electronics 902 from the frame 901. For example, the controller electronics 902 can be suspended from the heat exhaust component 904 by way of the thermally conductive vibration isolating connector 910 in combination with one or more additional vibration isolating connectors 928 (or without), and the heat exhaust component 904 can also be connected with the frame 901 by way of one or more additional vibration isolating connectors 934.

FIG. 10 is a cross sectional schematic view of a third example of a UAV 1000 employing a thermally conductive vibration isolating connector 1010 to support controller electronics 1002 with an exposed thermal exhaust element 1004 in a reversed orientation relative to UAV's 800, 900 described above. As discussed above, the specific orientation of the heat exhaust element 1004 and controller electronics 1002 can vary. In some embodiment, the controller electronics 1002 can be positioned above the heat exhaust element 1004. The heat exhaust element 1004 may be connected with the frame 1001 such that heat exhaust features 1026 project outward from the frame in various alternative orientations, such as outward from an inferior surface of the frame. In some embodiments, the thermally conductive vibration isolating connector 1010 may be sufficiently supportive to support the controller electronics 1002 absent additional supportive connectors.

FIGS. 11-14 illustrate example methods for assembling thermally conductive vibration isolating connectors with heat producing devices or within vehicles, as well as methods of transferring heat by way of a thermally isolating vibration isolating connector to cool a device. Some or all of the processes 1100, 1200, 1300, or 1400 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

FIG. 11 illustrates an example process 11000 for venting heat from an electronic device using a thermally conductive vibration isolating connector. In accordance with various embodiments, a flow of heat can be conducted away from the electronic device, typically a central processing unit or other integrated electronic chip of an integrated circuit board, through a first thermally conductive element to a first conductive surface (act 1102). This thermally conductive element can be an integral part of the heat generating component, such as a heat spreader attached with a processing unit, or can be a conductive block or similar element directly connected with the heat generating component, or similar.

The flow of heat can then be conducted from the first thermally conductive element into a thermally conductive liquid medium (act 1104). As described above, the liquid medium can be constrained by an enclosed cavity between the first thermally conductive element and a second thermally conductive element associated with a heat sink or heat exhaust assembly. Next, the flow of heat can be passed through the thermally conductive liquid medium by way of conduction and/or convection to the first thermally conductive element, which is separated from the first element by the liquid medium (act 1106). In some embodiments that additionally employ an MHD mixing device, the MHD device can be used to increase the rate of mixing of the liquid medium and thereby enhance the rate of convective heat transfer by the liquid medium (act 1107). The flow of heat can then be passed through the first thermally conductive element to a thermal exhaust assembly or heat sink (act 1108), such as but not limited to: a passive convection heat sink, active convection heat sink, liquid-cooled element, radiator, etc. In some embodiments, the flow of heat can be passed into a frame or structure associated with the heat generating electronic device (act 1109). For example, for a vehicle such as a UAV, the flow of heat can in some cases be exhausted directly to thermally conductive portions of the vehicle frame or body, which can be cooled by contact with the external environment. The flow of heat can be exhausted to an external environment (act 1110), e.g. by way of a dedicated heat exhausting assembly such as a heat sink with or without heat exhaust fins, or comparable assembly, or by the structure to which the thermal exhaust assembly is attached.

FIG. 12 illustrates a first example process 1200 for assembling a thermally conductive vibration isolating connector. In accordance with at least one embodiment, a flexible seal can be placed in contact with a second thermally conductive element and a first thermally conductive element, so that a volume enclosed by the first and second elements and flexible seal defines an enclosed cavity (act 1202). The enclosed cavity can then be filled with a thermally conductive liquid medium (act 1204), and the enclosed cavity can be sealed by adhering the first and second conductive elements with the flexible seal to fluidly seal the liquid medium inside the cavity (act 1206). In some embodiments, the flexible seal can be connected with one or the other of the thermally conductive elements before the combination is filled with the liquid medium. In some other embodiments, the flexible seal can be fully adhered with the thermally conductive elements prior to injection of the thermally conductive liquid medium through one of the conductive elements or through the flexible seal, or may be permanently bonded with the conductive elements, e.g., during manufacture of the flexible seal.

FIG. 13 illustrates a second example process 1300 for assembling a thermally conductive vibration isolating connector that employs an integrally connected flexible seal. In accordance with various embodiments, a flexible seal can be arranged in contact with a second thermally conductive element and first thermally conductive element (act 1302). A portion of the second thermally conductive element can be positioned within a volume defined by the flexible seal (act 1304), and a portion of the first thermally conductive element can be positioned with the volume spaced apart from the first element (act 1306). In some embodiments, the flexible seal can be formed around a preassembly of the second and first thermally conductive elements, so as to prevent either element from being removed from the seal.

Next, a cavity between the two conductive elements and within the flexible seal can be filled with a thermally conductive liquid medium as described above, optionally through an aperture in any one of the first or first thermally conductive elements (act 1308). As the liquid medium is pressurized, the second and first thermally conductive elements are pressed away from each other, causing them to firmly press against the flexible seal and firmly seal the enclosed cavity (act 1310). Once a predetermined gap or pressure is achieved, the aperture through which the assembly was filled with liquid medium can be sealed (act 1312). In some embodiments, the flexible seal can be further joined with the first and/or second conductive elements by the addition of adhesive (act 1314).

A thermally conductive vibration isolating connector can also be assembled between two thermally conductive elements by a combination of techniques described above with reference to FIGS. 12 and 13. For example, one thermally conductive element may be integrally formed with the flexible seal and the other adhered, or vice versa; or the second and first thermally conductive elements may be adhered with the flexible seal prior to injection of the assembly with liquid medium through an aperture.

FIG. 14 illustrates an example process 1400 for assembling a controller or other electronic component with a device or vehicle by a thermally conductive vibration isolating connector. First, a heat exhaust assembly is connected with a frame of a device or vehicle (act 1402), such as but not limited to a portable consumer device, computer, UAV, robot, automotive, industrial or commercial system, or other vibration- or shock-prone device that incorporates computer control. An electronic component is then connected with the heat exhaust assembly by a thermally conductive vibration isolating connecter as described above (act 1404). This thermally conductive vibration isolating connector may, in some cases, have sufficient mechanical strength to fully support the electronic component without additional supports. The electronic component can be operably connected by one or more electrical connectors, which typically do not provide mechanical support (act 1406). In some embodiments, the electronic component can be mechanically supported with respect to the heat exhaust assembly by mechanically connecting the electronic component with the heat exhaust assembly by way of vibration isolating connectors (act 1408). In some further embodiments, the electronic device can be further supported by direct connection between the electronic device and the frame of the device or vehicle by way of one or more additional vibration isolating connectors (act 1410).

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. An unmanned aerial vehicle (UAV), comprising:
a frame coupled with a plurality of thrust elements;
a heat exhaust element coupled with the frame and having a first heat conducting element;
a control element comprising a heat generating electronic element comprising an electronics board and an integrated chip mounted to the electronics board; and
a second heat conducting element integral to or coupled with the integrated chip to draw heat from the integrated chip, the second heat conducting element of the heat generating electronic element being thermally coupled with the first heat conducting element of the heat exhaust element by a thermally conductive vibration isolating connector comprising a flexible seal that encloses a thermally conductive liquid medium, the thermally conductive liquid medium separating the first and second heat conducting elements, wherein the thermally conductive vibration isolating connector supports the heat generating electronic element relative to the heat exhaust element, physically separates the heat generating electronic element from the frame, and accommodates relative movement of the heat generating electronic element relative to the frame and the heat exhaust element.

2. The UAV of claim 1, wherein the heat exhaust element is positioned at least partially external to the frame such that operation of the UAV causes an external flow of air to pass over the heat exhaust element.

3. The UAV of claim 1, wherein the control element is mechanically connected with the heat exhaust element or with the frame by at least one mechanical vibration isolating connector in addition to and separate from the thermally conductive vibration isolating connector.

4. The UAV of claim 1, wherein the control element is mechanically connected with the heat exhaust element and supported therefrom by only the thermally conductive vibration isolating connector.

5. The UAV of claim 1, wherein the control element is supported above the heat exhaust element by the thermally conductive vibration isolating connector.

6. The UAV of claim 1, wherein the thermally conductive vibration isolating connector comprises a gap between the first and second thermally conductive elements of 5-15 mm that can repeatedly compress or extend by at least 30%.

7. The UAV of claim 1, wherein the thermally conductive liquid medium comprises one of a liquid metal, liquid metal alloy, or liquid/particulate suspension that has a thermal conductivity of at least 2 $Wm^{-1}K^{-1}$.

8. A vehicle, comprising:
a frame;
a heat exhaust element mounted to the frame and having a first heat conductive element; and
a heat generating electronic device comprising an electronics board, an integrated chip mounted to the electronics board, and a second heat conductive element integral to or connected to the integrated chip, wherein the first and second heat conductive elements are mechanically and thermally coupled by a thermally conductive vibration isolating connector comprising a flexible seal that encloses a thermally conductive liquid medium separating the first and second heat conducting elements such that the thermally conductive vibration isolating connector supports the heat generating electronic device relative to the heat exhaust element, physically separates the heat generating electronic device from the frame, and accommodates relative movement of the heat generating electronic device relative to the frame and the heat exhaust element.

9. The vehicle of claim 8, wherein the heat exhaust element comprises a passive convection heat sink assembly having one or more heat exhaust fins positioned external to the frame and configured to interact with air in an external environment.

10. The vehicle of claim 8, wherein the heat exhaust element comprises an active convection heat sink assembly having one or more heat exhaust fins thermally coupled with the second heat conducting element and one or more fans arranged to pass air from an over the one or more heat exhaust fins.

11. The vehicle of claim 8, wherein the first and second heat conducting elements are separated by a distance of 1 mm to 15 mm.

12. The vehicle of claim 8, wherein the first and second heat conducting elements comprise respective first and second heat conducting surfaces, and wherein at least one of the first and second heat conducting surfaces is coated with a corrosion-resistant layer configured to mitigate or prevent attack by the thermally conductive liquid medium.

13. The vehicle of claim 12, wherein the corrosion-resistant layer comprises one or more of: graphite, graphene, cubic boron, zinc, nickel, diamond, amorphous carbon, or anodization.

14. The vehicle of claim 8, wherein one or both of the first and second heat conducting elements comprise one or more of graphite, graphene, cubic boron, zinc, nickel, diamond, amorphous carbon, or anodization.

15. The vehicle of claim 8, wherein the thermally conductive liquid medium comprises a liquid metal or liquid metal alloy selected from mercury, a gallium indium eutectic alloy, or similar metal; or a particulate suspension of oil or water containing heat conducting particles.

16. The vehicle of claim 8, wherein the first and second heat conducting elements comprise respective first and second heat conducting surfaces, and wherein the first and second heat conducting surfaces further comprise high-surface area shapes selected from: alternating positive and negative surface features, ball-and-socket, or fins.

17. The vehicle of claim 8, wherein the first heat conductive element comprises a first flanged structure, the second heat conductive element comprises a second flanged structure, the flexible seal is shaped to partly encompass the first and second flanged structures, and the thermally conductive liquid medium biases the first and second flanged structures away from each other and against the flexible seal.

18. The vehicle of claim 8, wherein the electronics board is further suspended relative to the heat exhaust element by at least one vibration isolating mechanical connector separate from the thermally conductive vibration isolating connector.

19. A method of assembling a heat generating electronic device with a vehicle, the method comprising:
    connecting a heat exhaust assembly with a frame of the vehicle; and
    connecting the heat generating electronic device with the heat exhaust assembly by a thermally conductive vibration isolating connector, the thermally conductive vibration isolating connector comprising a first heat conducting element and a second heat conducting element separated by a nonzero distance, the first and second heat conducting elements connected by a flexible seal that encloses a thermally conductive liquid medium separating the first and second heat conducting elements, wherein:
    the first heat conducting element is thermally connected with the heat exhaust assembly and the second heat conducting element is thermally connected with the heat generating electronic device, and
    the thermally conductive vibration isolating connector supports the heat generating electronic device relative to the heat exhaust assembly, physically separates the heat generating electronic device from the frame, and accommodates relative movement of the heat generating electronic device relative to the frame and the heat exhaust assembly.

20. The method of claim 19, further comprising mechanically connecting the heat generating electronic device with the frame of the vehicle by at least one mechanical vibration isolating connector in addition to and separate from the thermally conductive vibration isolating connector.

21. The method of claim 19, wherein the heat generating electronic device comprises a vehicle controller and the vehicle further comprises one or more actuators or motors; and further comprising:
    operably connecting the vehicle controller with the one or more actuators or motors.

\* \* \* \* \*